United States Patent [19]
Blair et al.

[11] Patent Number: 5,170,124

[45] Date of Patent: Dec. 8, 1992

[54] METHOD AND APPARATUS FOR MONITORING FUEL CELL PERFORMANCE

[75] Inventors: James D. Blair, Vancouver; Kenneth Dircks, North Vancouver, both of Canada

[73] Assignee: Her Majesty the Queen as represented by the Minister of National Defence of Her Majesty's Canadian Government, Ottawa, Canada

[21] Appl. No.: 642,052

[22] Filed: Jan. 16, 1991

[30] Foreign Application Priority Data

Jun. 8, 1990 [CA] Canada ................................ 2018639

[51] Int. Cl.$^5$ .................... G01N 27/416; G08B 21/00
[52] U.S. Cl. .................................. 324/434; 340/636; 324/433
[58] Field of Search ...................... 324/433, 434, 435; 340/636; 320/48

[56] References Cited

U.S. PATENT DOCUMENTS

| | | | |
|---|---|---|---|
| 2,621,231 | 12/1952 | Medlar | 324/434 |
| 2,675,522 | 4/1954 | Godshalk | 324/434 |
| 3,872,457 | 3/1975 | Ray et al. | 340/636 |
| 4,053,824 | 10/1977 | Dupuis et al. | 320/48 |
| 4,134,060 | 1/1979 | Feldman | 324/434 |
| 4,316,185 | 2/1982 | Watrous et al. | 324/433 |
| 4,424,491 | 1/1984 | Bobbett et al. | 324/433 |
| 4,622,508 | 11/1986 | Matteau et al. | 320/48 |
| 4,647,860 | 3/1987 | Marshall | 324/434 |
| 4,931,738 | 6/1990 | MacIntyre et al. | 324/433 |

FOREIGN PATENT DOCUMENTS

| | | |
|---|---|---|
| 60-54176 | 7/1985 | Japan . |
| 60-216466 | 3/1986 | Japan . |
| 61-91877 | 9/1986 | Japan . |
| 62-163267 | 7/1987 | Japan . |
| 62-271357 | 5/1988 | Japan . |
| 2-78159 | 6/1990 | Japan . |

Primary Examiner—Jack B. Harvey
Assistant Examiner—Maura K. Regan
Attorney, Agent, or Firm—McAndrews, Held & Malloy, Ltd.

[57] ABSTRACT

A method and apparatus for monitoring the performance of fuel cells arranged in series. More particularly, the method and apparatus involve the measurement and comparison of fuel cell performance indicators, such as voltage, in groups of cells connected in series. In a first embodiment, the voltage across each fuel cell group is compared to a reference voltage equal to a predetermined minimum voltage. In a second embodiment, the voltage across each group is compared to a reference voltage equal to the average across all fuel cell groups. In a third embodiment, a reference voltage equal to the voltage across one group is compared to the voltage across each of the other fuel cell groups. In a fourth embodiment, the voltage across each group is compared as a reference voltage to the voltage across an adjacent fuel cell group. Other embodiments comprising various combinations of the first, second, third and fourth embodiments are also provided. An alarm is activated, and supply of fuel to the cells discontinued, when the measured voltage for a fuel cell group varies from the reference voltage by more than a predetermined voltage differential.

39 Claims, 4 Drawing Sheets

METHOD AND APPARATUS FOR MONITORING FUEL CELL PERFORMANCE

FIELD OF THE INVENTION

This invention relates to a method and apparatus for monitoring performance indicators, such as voltage, in groups of fuel cells arranged electrically in series. More particularly, this invention relates to a method and apparatus for comparing such performance indicators in a stack of such cells, connected electrically in series, for the purpose of controlling the fuel cell and its supporting equipment and to prevent operation in regimes which might cause damage to the fuel cell stack or represent a hazard.

BACKGROUND OF THE INVENTION

Fuel cells are useful sources of clean electricity. One type of common fuel cell is fuelled by hydrogen and oxygen or air (which contains about 19 percent oxygen) to generate direct current electricity. Such fuel cells are clean, highly efficient and environmentally attractive.

It is useful to be able to monitor the performance of hydrogen-oxygen or hydrogen-air fuel cells to ensure that they are operating efficiently. It is also important to be able to detect any deterioration in performance before the fuel cell becomes a hazard to equipment investment and human beings. A hydrogen-oxygen fuel cell usually develops about 0.6 to 1.0 volt of electricity. In order to generate higher voltages, and more power, it is common practice to arrange a number of cells electrically in series in what is referred to as a fuel cell stack. As a stack may contain 50 or more cells, it is difficult and prohibitively expensive to monitor the performance of each individual cell in a stack.

It is important, however, to assure that the power being drawn from the stack does not force any individual cell into an abusive or hazardous operating range. It is also important to be able to detect the failure of fuel-/oxidant separation in a single cell. It is desirable to monitor cell performance as part of a system control strategy for the equipment which supports the operation of the fuel cell.

Sufficient information cannot be obtained from the total stack voltage, particularly in circumstances of significantly varying load, as the change in the stack voltage can be large as compared to the voltage of a single cell. It is also not practical to store in a control system a table of acceptable stack voltages over the operative power range, as these values will vary with operating temperature, fuel and oxidant pressure, outside air pressure, temperature and humidity, and the extent of stack aging.

It is desirable, therefore, to be able to monitor the cell voltages with sufficient resolution to detect inadequate performance in a single cell and to have a reference voltage which reflects the expected value for the given operating conditions and stack age.

The inventors are not aware of such an approach as described herein having been used in monitoring and controlling fuel cells. The only remotely analogous prior art known to the inventors is the monitoring of the voltages of individual batteries in installations of many batteries connected in series.

As used herein, the term "normalized measured voltage" refers to the measured voltage across a group of fuel cells, normalized according to the number of fuel cells in the group. Similarly, the term "normalized total voltage" refers to the measured voltage across the total number of fuel cells, or alternately the cumulative total of the measured voltages across each fuel cell group, normalized according to the total number of fuel cells. For example, if twenty total fuel cells are divided into four groups composed of (a) three, (b) four, (c) six (d) and seven cells, respectively, and the measured voltages across the groups is (a) 1.2 volts, (b) 2.0 volts, (c) 3.0 volts, and (d) 4.2 volts, then the normalized measured voltage is 0.4 volts per cell for group (a), 0.5 volts per cell for group (b), 0.5 volts per cell for group (c) and 0.6 volts per cell for group (d). The normalized total voltage in the above example is 1.2+2.0+3.0+4.2 volts divided by 20 cells, or 0.52 volts per cell. Use of normalized voltages permits the comparison of measured voltages between groups composed of unequal numbers of fuel cells. In practice, the comparison of performance indicators between groups can be made on a per cell basis or on a per group basis where the groups consist of equal numbers of cells.

OBJECTS OF THE INVENTION

An objective of this invention is to provide a means for determining that one or more cells in a multi-cell stack is performing below desired levels without the need to monitor all cells.

It is a further objective of this invention to provide a reference voltage which represents acceptable cell performance under the existing operating conditions of the stack.

It is a still further objective of this invention to provide an alarm signal in the event that one or more cells in a multi-cell stack is found to be operating at a level substantially below the acceptable reference voltage under the existing operating conditions or below the minimum voltage specified for the system, regardless of operating conditions. It is another objective of this invention that the alarm signal may be used to modify the operating conditions of the fuel cell stack or to effect an automatic shut-down of the fuel cell stack and its supporting equipment.

SUMMARY OF THE INVENTION

The invention includes a first method of monitoring the performance of a plurality of electrical series connected fuel cells. The first method comprises:

dividing the fuel cells into at least two groups, measuring the voltage across each fuel cell group, and comparing the normalized measured voltage of each fuel cell group with a reference voltage equal to a predetermined minimum voltage.

The first method preferably further comprises activating an alarm when the normalized measured voltage across a fuel cell group is less than the reference voltage. The preferred predetermined minimum voltage is about 0.5 volts per cell.

A second method of monitoring the performance of a plurality of series connected fuel cells comprises:

dividing the fuel cells into at least two groups, measuring the voltage across each fuel cell group, and comparing the normalized measured voltage of each fuel cell group with a reference voltage equal to the normalized total voltage across the plurality of series connected fuel cells.

A third method of monitoring the performance of a plurality of series connected fuel cells comprises:

dividing the fuel cells into at least two groups, measuring the voltage across each fuel cell group, and comparing the normalized measured voltage of one fuel cell group as a reference voltage with the normalized measured voltage of each of the other fuel cell groups.

The third method can be employed iteratively, the one fuel cell group providing the normalized reference voltage in the first iteration being selected from the plurality of fuel cell groups, and the fuel cell group providing the normalized reference voltage in succeeding iterations being selected from the remaining, previously unselected fuel cell groups. In the preferred iterative method, a first outer fuel cell group provides the normalized reference voltage in the first iteration, the adjacent inner group provides the normalized reference voltage in the second iteration, the next adjacent inner groups provide, in sequence, the normalized reference voltage in succeeding iterations, and the second outer group provides the normalized reference voltage in the final iteration. The preferred iterative method can be repeated as desired.

A fourth method of monitoring the performance of a plurality of series connected fuel cells comprises:

dividing the fuel cells into at least three groups including a first outer fuel cell group, at least one inner fuel cell group, and a second outer fuel cell group, measuring the voltage across each fuel cell group, comparing the normalized measured voltage of the first outer fuel cell group as a reference voltage with the normalized measured voltage of the adjacent inner fuel cell group, comparing in sequence the normalized measured voltage of each inner fuel cell group as a reference voltage with the normalized measured voltage of the next adjacent fuel cell group, and comparing the normalized measured voltage of the second outer fuel cell group as a reference voltage with the normalized measured voltage of the first outer fuel cell group.

The second, third and fourth methods preferably further comprise activating an alarm when the normalized measured voltage across a fuel cell group varies from the reference voltage by a predetermined voltage differential. The preferred predetermined voltage differential is between about 20 millivolts per cell and about 200 millivolts per cell. The most preferred predetermined voltage differential is about 100 millivolts per cell.

A fifth method of monitoring the performance of a plurality of electrical series connected fuel cells is a combination of the first and second methods, and comprises:

dividing the fuel cells into at least two groups, measuring the voltage across each fuel cell group, comparing the normalized measured voltage of each fuel cell group with a first reference voltage equal to a predetermined minimum voltage, and comparing the normalized measured voltage of each fuel cell group with a second reference voltage equal to the normalized total voltage across the plurality of series connected fuel cells.

A sixth method of monitoring the performance of a plurality of electrical series connected fuel cells is a combination of the first and third methods, and comprises:

dividing the fuel cells into at least two groups, measuring the voltage across each fuel cell group, comparing the normalized measured voltage of each fuel cell group with a first reference voltage equal to a predetermined minimum voltage, and comparing the normalized measured voltage of one fuel cell group as a second reference voltage with the normalized measured voltage of each of the other fuel cell groups.

A seventh method of monitoring the performance of a plurality of electrical series connected fuel cells is a combination of the first and fourth methods, and comprises:

dividing the fuel cells into at least three groups including a first outer fuel cell group, at least one inner fuel cell group, and a second outer fuel cell group, measuring the voltage across each fuel cell group, comparing the normalized measured voltage of each fuel cell group with a first reference voltage equal to a predetermined minimum voltage, comparing the normalized measured voltage of the first outer fuel cell group as a second reference voltage with the normalized measured voltage of the adjacent inner fuel cell, comparing in sequence the normalized measured voltage of each inner fuel cell group as a second reference voltage with the normalized measured voltage of the next adjacent fuel cell group, and comparing the normalized measured voltage of the second outer fuel cell group as a second reference voltage with the normalized measured voltage of the first outer fuel cell group.

The fifth, sixth and seventh methods preferably further comprise activating an alarm when the normalized measured voltage across a fuel cell group is less than the first reference voltage or when the normalized measured voltage across a fuel cell group varies from the second reference voltage by a predetermined voltage differential. The preferred predetermined minimum voltage is about 0.5 volts per cell and the preferred predetermined voltage differential is between about 20 millivolts per cell and about 200 millivolts per cell. The most preferred predetermined voltage differential is about 100 millivolts per cell.

An eighth method of monitoring the performance of a plurality of electrical series connected fuel cells is a combination of the first, second and third methods, and comprises:

dividing the fuel cells into at least two groups, measuring the voltage across each fuel cell group, comparing the normalized measured voltage of each fuel cell group with a first reference voltage equal to a predetermined minimum voltage, comparing the normalized measured voltage of each fuel cell group with a second reference voltage equal to the normalized total voltage across the plurality of series connected fuel cells, and comparing the normalized measured voltage of one fuel cell group as a third reference voltage with the normalized measured voltage of each of the other fuel cell groups.

A ninth method of monitoring the performance of a plurality of electrical series connected fuel cells is a combination of the first, second and fourth methods, and comprises:

dividing the fuel cells into at least three groups including a first outer fuel cell group, at least one inner fuel cell group, and a second outer fuel cell group, measuring the voltage across each fuel cell group, comparing the normalized measured voltage of each fuel cell group with a first reference voltage equal to a predetermined minimum voltage, comparing the normalized measured voltage of each fuel cell group with a second reference voltage equal to the normalized total voltage across the plurality of series connected fuel cells, comparing the normalized measured voltage of the first outer fuel cell group as a third reference voltage with the normalized measured voltage of the adjacent inner fuel cell group, comparing in sequence the normalized measured voltage of each inner fuel cell group as a third reference voltage with the normalized measured voltage of the next adjacent fuel cell group, and comparing the normalized measured voltage of the second outer fuel cell group as a third reference voltage with the normalized measured voltage of the first outer fuel cell group.

The eighth and ninth methods preferably further comprise activating an alarm when the normalized measured voltage across a fuel cell group is less than the first reference voltage or when the normalized measured voltage across a fuel cell group varies from the second reference voltage or the third reference voltage by a predetermined voltage differential. The preferred predetermined minimum voltage is about 0.5 volts per cell and the preferred predetermined voltage differential is between about 20 millivolts per cell and about 200 millivolts per cell. The most preferred predetermined voltage differential is about 100 millivolts per cell.

The first through ninth methods most preferably further comprise performing the respective methods repeatedly and discontinuing the supply of fuel to the fuel cells upon continuous activation of the alarm for a predetermined time period. The preferred predetermined time period is between about 0.5 seconds and about 2.0 seconds.

BRIEF DESCRIPTION OF THE DRAWINGS

In drawings which illustrate specific embodiments of the invention but which should not be construed as restricting the spirit or scope of the invention in any way.

DETAILED DESCRIPTION OF THE DRAWINGS

Figure 1:
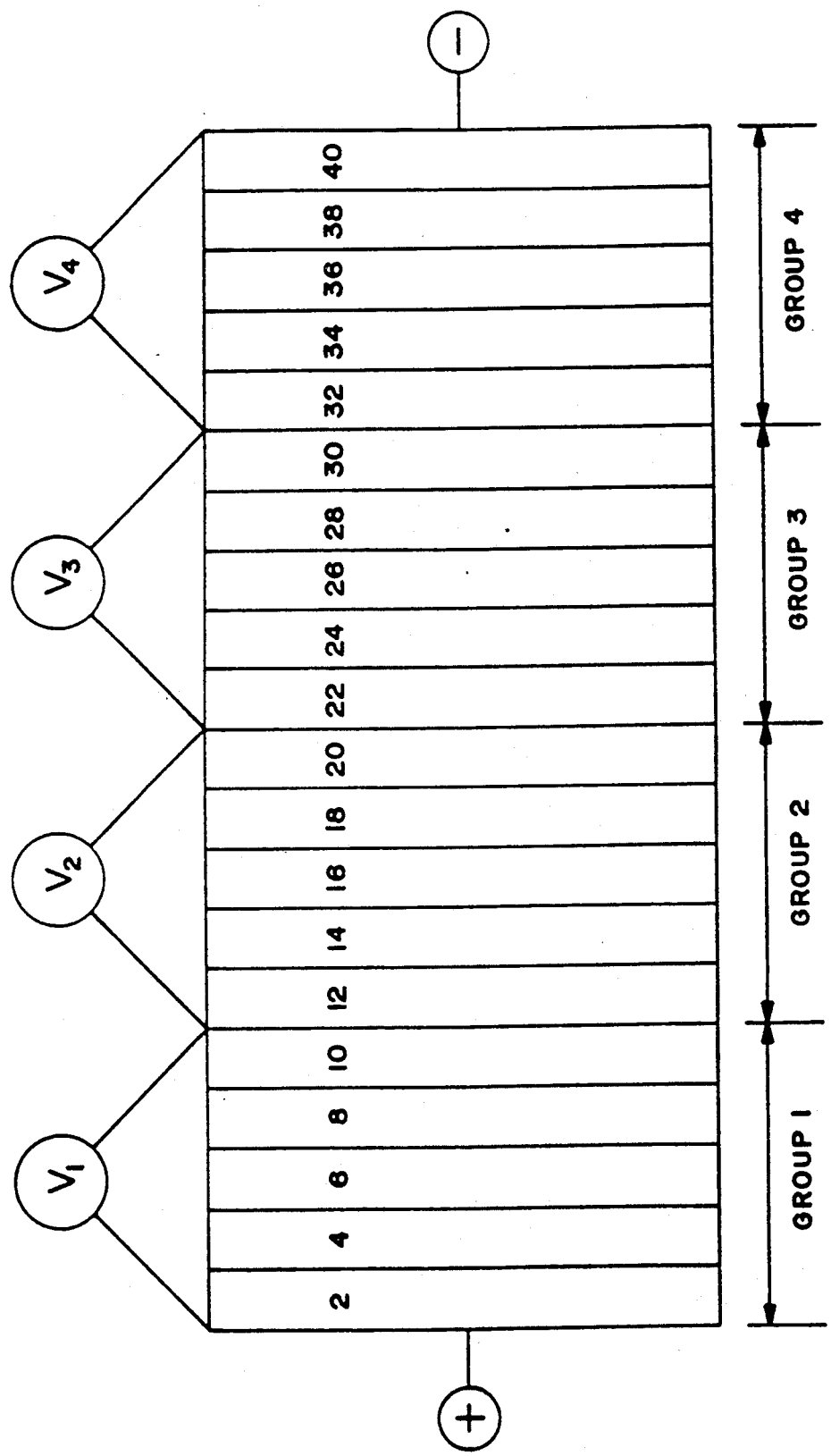
FIG. 1 illustrates a schematic view of a plurality of fuel cells arranged in series and divided into four groups.

Referring to the drawings, FIG. 1 illustrates a schematic representation of twenty fuel cells connected in a stack in series. Each fuel cell, depending on load, typically generates a voltage of about 0.6 to about 1.0 volts. When connected in series, the sum of the voltages generated by the fuel cells, depending upon load, and assuming that all fuel cells are operating efficiently, would be about 12 to about 16 volts. It is understood by those skilled in the art that higher voltages can be achieved by adding more fuel cells to the stack in series. For the purpose of illustrating the invention, only twenty fuel cells in a stack are depicted. In practice, there may be fifty or more fuel cells in a stack.

A problem with connecting a stack of fuel cells in series is that it is difficult or complicated to monitor the performance of each fuel cell. If the total power output drops, it is, of course, readily noted that there is a drop in power. But it is difficult to isolate which one or more of the fuel cells in the stack is operating below acceptable performance standards and thus causing or contributing to the loss in power. It is important, therefore, to be able to isolate and identify that one or more of the fuel cells is operating below acceptable standards, and is failing to contribute its correct increment of electrical power to the overall fuel cell stack.

It is desirable that no cell in a multi-cell fuel cell stack operates at a voltage below a prescribed minimum cell voltage. This minimum cell voltage may vary from one fuel cell system to another, but will generally be in the range of 0.5 to 0.6 V per cell. At a minimum, then, a control system should assure that the total cell stack voltage not fall below the minimum cell voltage multiplied by the number of cells in the stack. But such a system cannot assure that no one cell is operating below the desired minimum cell voltage. The ultimate control system would monitor the voltage of each cell individually, but such a system would be prohibitively expensive. The specification of the minimum cell voltage is arbitrary and may vary from one fuel cell system to another. The designation of a stack reference voltage which represents acceptable performance under the specific stack operating conditions present at a given instant is much more difficult, as a variety of conditions will determine that value. The inventors have identified two general approaches to this problem.

In the first general approach, the voltages of groups of cells are compared against one another under the existing operating conditions. In the simplest case in which one cell in one cell group is performing substantially below all other cells, the voltage of the cell group containing that cell would be found to be less than the voltage of any other cell group against which it was compared. Thus, the other cell groups provide a valid reference voltage for a cell group operating under the existing conditions. Only in the very unlikely eventuality that all cell groups contained the exact same number of cells performing at exactly the same unacceptable level would such an approach fail to detect unacceptable performance.

In the second approach, the reference voltage is taken as the overall stack voltage divided by the number of cell groups. This reference voltage will be diminished slightly by the presence of one or more sub-standard cells in the stack, but, assuming that there are a relatively large number of cells in the stack as compared to the number of sub-standard cells, the reference voltage will still be discernably higher than the voltage of a group containing a cell which is not performing acceptably.

In either approach, it is necessary to define a difference in voltage between the voltage of a cell group and the reference voltage which triggers an alarm. For a system in which the groups consist of about five cells each, a voltage difference of 100 to 1000 millivolts, or 20 to 200 millivolts on a per cell basis, has been found to serve as a meaningful discriminator between acceptable cell-to-cell variation and an indication of sub-standard performance from a single cell. A voltage difference of about 500 millivolts, or about 100 millivolts on a per cell basis, has been found most preferable for a system in which the groups consist of five cells each.

In operation, the control system, based upon the cell voltage comparator, sends an alarm signal if any of the following conditions occurs: (1) the overall stack voltage falls below the defined minimum cell voltage, typically 0.6 volts, multiplied by the number of cells in the stack; (2) the voltage for any group of cells falls below the defined minimum cell voltage multiplied by the number of cells in a cell group; or (3) the magnitude of the difference between the voltage of a cell group and the reference voltage is greater than some defined value, typically about 100 to 300 millivolts, most preferably about 200 millivolts.

Another reason for wanting to identify sub-par performance of cells in a stack of fuel cells, is to guard against the development of a potentially hazardous situation. Since the fuel cells in the stack shown in FIG. 1 typically operate using hydrogen gas and oxygen, or air, as fuels, a potentially hazardous condition can develop in any cell in which the hydrogen is able to commingle with the oxygen. One common reason why a fuel cell may not be operating up to acceptable efficiency is that there is a leak in the electrolyte membrane separating the anode from the cathode side of the fuel cell. Thus, hydrogen gas is able to leak through the membrane and mix with the oxygen, thereby creating a potentially dangerous situation, which could lead to a fire, or even an explosion.

While an important aspect of the use of the cell voltage comparator is to shut the fuel cell system down in the event of an incident which allows the mixing of fuel and oxidant (and which thus poses the danger of fire), the system is far more often used to prevent the operation of the system at power levels which might damage the unit. The information from the cell voltage comparator is also used to control the operation of auxiliary equipment, such as air compressors, to optimize fuel cell performance.

Figure 4:
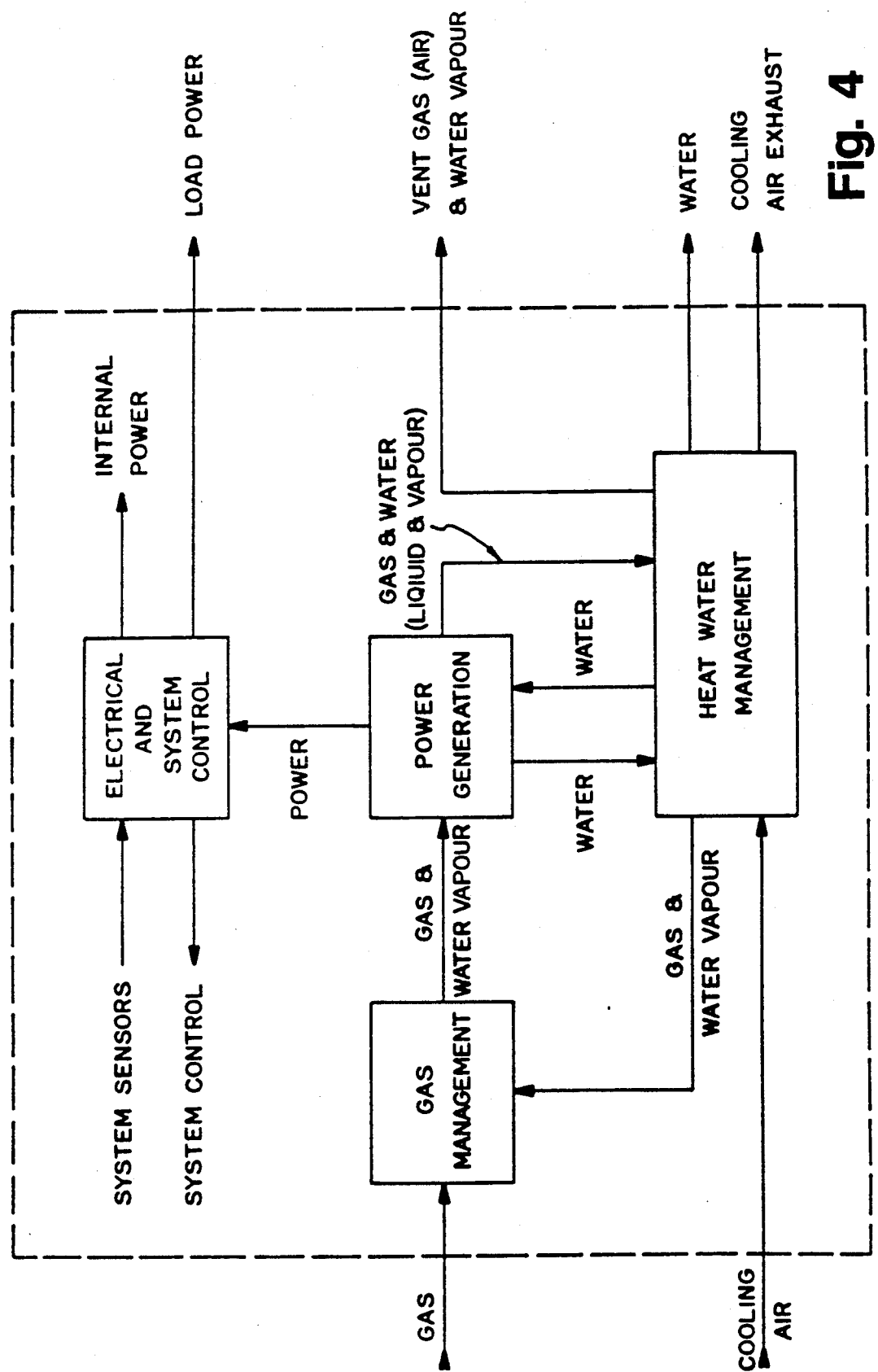
FIG. 4 illustrates a schematic-block diagram depiction of the components of a fuel cell power plant.

It will be understood by those skilled in the art that the stack of fuel cells depicted in FIG. 1 is supported and operated by a complex fuel cell support system including oxidant (air or oxygen) inlets and outlets, hydrogen inlets and outlets, cooling water inlets and outlets, solenoid valves, water knockout devices, electronic support systems such as instrumentation and computers, air compressors, hydrogen sources, and the like. To keep the illustration of the invention simple, none of this support hardware is shown in FIG. 1. A schematic-block diagram depiction of a fuel cell power plant with support systems is depicted in FIG. 4. The support systems and equipment depicted in FIG. 4 are well known to any person skilled in the art of fuel cell technology and accordingly no detailed description of the support systems will be given. Such systems do not constitute part of the invention. The stack of fuel cells are located in the block entitled "Power Generation". The flow of fuel gas and cooling air is depicted. Cooling water control is identified with the block entitled "Heat/Water Management". If a hazardous situation develops, that is, hydrogen or oxidant are mixing in the fuel cell (a condition which can be identified by a reduction in voltage output of the fuel cell) then it is necessary to be able to rapidly shut down the support system (explained below) so that the hazardous situation does not reach a potentially dangerous point which may result in a fire or an explosion.

The invention pertains to an apparatus and method which can measure and compare cell voltage outputs of groups of cells in the fuel cell stack, and if a hazardous situation reflected by a noticeable drop in voltage is sensed, output an alarm signal, or initiate process control procedures to normalize the situation. The alarm signal is adapted to order the system logic controller (not shown) to implement a shut-down sequence, or commence remedial process control procedures.

Several reasons why it may be advantageous to shut down the fuel support system, or modify the process control parameters, when the alarm signal occurs are as follows:

1. To protect people and property in the vicinity of the fuel cell from the risk of an explosion or a fire. This can occur when the reactant gases, hydrogen and oxygen or air, can mix when there is a leak in the membrane electrolyte in the fuel cell;

2. To protect the fuel cell stack from electrical overload; and

3. To protect the load from overload.

An obvious way to measure the performance of each fuel cell in a stack of fuel cells would be to measure the voltage output of each individual fuel cell. However, this would be a cumbersome and expensive technique. A tremendous amount of data would be generated and would be costly and time consuming to process.

In the realities of the commercial world, fuel cells connected in stacks in series and providing power to consumers do not operate under static conditions. Power demands on the system are constantly changing. In practical environments, therefore, the operating conditions of a stack of fuel cells connected in electrical series are dynamic and constantly changing, depending upon load requirements on the stack. Any performance monitoring system must therefore be able to perform a number of functions:

1. The practical cell voltage comparator in such a system must be able to maintain accuracy from no load (idle) to full load on the fuel cell stack.

2. The cell voltage comparator in such a system must have a reference voltage that tracks in time to the measured voltage. Otherwise the measurement is constantly out of step.

3. The cell voltage comparator in such a system must be able to take differential voltage measurements.

4. The system must be able to perform satisfactorily in an environment of high common mode voltages. In other words, the system must be galvanically isolated from the input to the control system ground.

5. The system must be able to ignore data received from impulse loads (preferably less than 0.5 to 2 seconds).

6. The system must latch the alarm signal to the "ON" state for loop stability. Otherwise, the alarm control system will oscillate.

To satisfy these criteria, and at the same time, to reduce complexity, increase efficiency, reduce cost, and enable the cell voltage comparator to effectively monitor a stack of fuel cells connected in electrical series, we have invented a method and apparatus to monitor the voltage output of groups of cells, rather than individual fuel cells. FIG. 1 illustrates schematically, a stack of twenty fuel cells connected in electrical series. In reality, the stack of cells would normally comprise fifty or more cells. However, the arrangement illustrated in FIG. 1 is sufficient for explanatory purposes. The stack of twenty cells is divided into four individual groups of five cells each. These groups are designated as Group 1, Group 2, Group 3 and Group 4. Each individual group has an individual voltage measuring unit measuring the voltage output for that specific group. Voltage measuring unit designated $V_1$ measures the voltage generated by the five electrical series connected fuel cells 2, 4, 6, 8 and 10 making up Group 1. Likewise, voltage measuring unit $V_2$ measures the voltage generated by the adjacent five series connected fuel cells 12, 14, 16, 18 and 20 making up Group 2. Voltage measuring unit $V_3$ measures the output voltage of the five series connected cells 22, 24, 26, 28 and 30 in group 3. Lastly, voltage measuring unit $V_4$ measures the voltage generated by the five series connected fuel cells 32, 34, 36, 38 and 40 making up Group 4.

Figure 3:
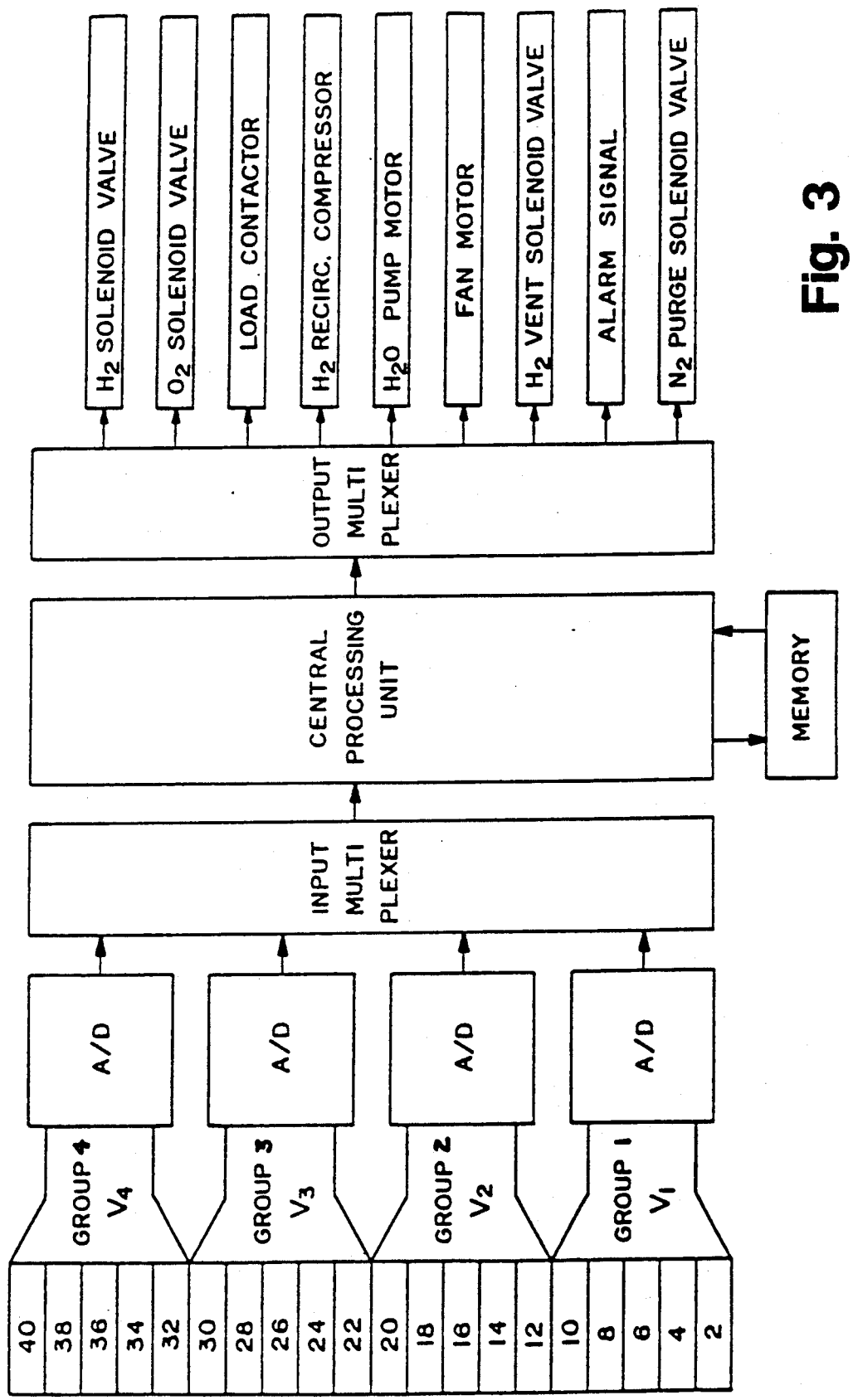
FIG. 3 illustrates a block diagram of the components comprising the cell voltage comparator.

To make an effective cell voltage comparator, and thus be able to monitor the performance of a group of cells, the voltage generated by a group of five series connected fuel cells must be compared relative to a reference voltage. Such comparison can be conducted by a suitable computer together with appropriately programmed software. FIG. 3 illustrates a block diagram of the components comprising the cell voltage comparator. The CPU hardware employed by the applicant in its prototype is a Motorola brand 6802 chip. The software required to operate the cell voltage comparator is straightforward and can be developed by any skilled in the art computer programmer.

The cell voltage comparator must be able to distinguish between the summation of expected random variations in cell performance found in a stack and an unacceptable variation in the performance of a single cell. This can be accomplished by the proper selection of the voltage difference between a cell group and the reference voltage at which an alarm is triggered. For a five cell group, a difference of between 100 and 1000 mV (between 20 and 200 mV on a per cell basis), most preferably about 500 mV (about 100 mV on a per cell basis), has been found to discriminate between random variations and unacceptable performance.

At the same time, the cell voltage comparator must be insensitive to short term variations in performance, whether caused by brief, self-correcting internal disturbances or by external electrical factors. To maintain essentially continuous monitoring of fuel cell performance, voltage measurements and comparisons are made several times per second, typically from one to ten times per second. The cell voltage comparator is rendered insensitive to instantaneous spikes and other noise, by requiring that an alarm situation be detected for several consecutive measurements over a period of from 0.5 to 2.0 seconds before an alarm is sounded.

There are a number of different ways to operate the cell voltage comparator system depicted in FIG. 1. These methods are described below.

Method 1

According to this method, the voltage designated as $V_1$, generated by fuel cell Group 1, is used as the reference voltage. Then, sequentially, by means of a computer and a suitable electronic computer program, and associated electronic circuitry and support systems (see FIGS. 3 and 4), the voltage $V_2$ generated by cell Group 2 can be compared with voltage $V_1$. If voltage $V_2$ differs from the reference voltage $V_1$ by more than the allowed voltage difference, then an alarm is activated by the hardware and software and a support system process alteration or a shut-down procedure is initiated. Subsequently, in sequence, voltage $V_3$ of cell Group 3 is compared to voltage $V_1$, and again, if $V_3$ differs from the reference voltage by more than the allowed voltage difference, an alarm is activated and the process alteration or shut-down procedure is initiated. Subsequently, voltage $V_4$ is compared with voltage $V_1$, and if $V_4$ differs from the reference voltage by more than the allowed voltage difference, the process alteration or shut-down procedure is initiated. Once voltage $V_4$ has been measured, the process is repeated in sequence on a continuous basis. A continuous fuel cell performance monitoring system is carried out.

The disadvantage of this method is that it relies on a single group voltage, in the case of the example $V_1$, as the reference voltage. It is possible, however, that the cell group chosen as the reference voltage might contain a malfunctioning cell and thus not represent the true expected voltage under a given set of operational circumstances. Consider the situation in which the fuel cell stack illustrated in FIG. 1 contained two cell groups which were performing properly, and one group which was not performing adequately, as indicated by a lower voltage which differed from the voltage of the two good groups by slightly more than the specified voltage differential. Should the group selected to be the reference group have slightly degraded performance with a voltage half way between the voltages of the two satisfactory groups and the single unsatisfactory group, method 1 would not detect the impending failure of the unsatisfactory group.

Method 2

This method is a modification of method 1. According to this method, voltage $V_1$ is used as the reference voltage for the first sequential voltage comparison. Voltage $V_2$ is compared to reference voltage $V_1$ to monitor the "health" of Group 2. However, for the next voltage measurement of fuel cell Group 3, voltage $V_2$ is used as the reference voltage, and voltage $V_3$ of Group 3 is compared to voltage $V_2$. Subsequently, in sequence, the voltage $V_3$ is used as the reference voltage and voltage $V_4$ of Group 4 is compared to voltage $V_3$ as the reference voltage. Then, for the next sequential monitoring cycle, voltage $V_4$ is used as the reference voltage, and voltage $V_1$ is compared to $V_4$.

This method has the advantage that no single fuel cell group is used as the sole reference voltage. The reference voltage in sequence changes from one cell group to the next. Hypothetically, each of the reference voltages in series could drop in level the same amount, but the likelihood of this occurring is much lower than for Method 1 described above, wherein only one cell group is used as the reference voltage.

Other variations of method 2, in which the group used as the reference voltage is varied in sequence, will be obvious to those skilled in the art. For example, $V_2$ might be selected as the first reference and $V_2$, $V_3$, and $V_4$ compared against it. Then $V_2$ would be selected as the reference and $V_3$, $V_4$, and $V_1$ would be compared against it, and so on until $V_1$ was again the reference voltage. The key to method 2 is the variation of the group selected as the reference group, not the sequence in which other groups are compared against the reference.

Method 3

According to this method, the total voltage output of the entire stack of fuel cells, namely, the voltage sum of Group 1, Group 2, Group 3 and Group 4, divided by the number of groups (four in this case), is used as the reference voltage. Sequentially, voltage $V_1$ is compared to the group reference voltage. Then, in turn, voltage $V_2$, voltage $V_3$, and voltage $V_4$ are compared with the group reference voltage.

The advantage of this system is that the group reference voltage obtained by dividing the total voltage output by the number of cell groups is most likely to be at a characteristic reference level. If the performance of a specific cell group deteriorates, it will only marginally affect the reference voltage because the reference voltage is the sum of the voltages of all groups divided by the group number. This method maintains its accuracy from a no load condition to a full load condition.

Figure 2:
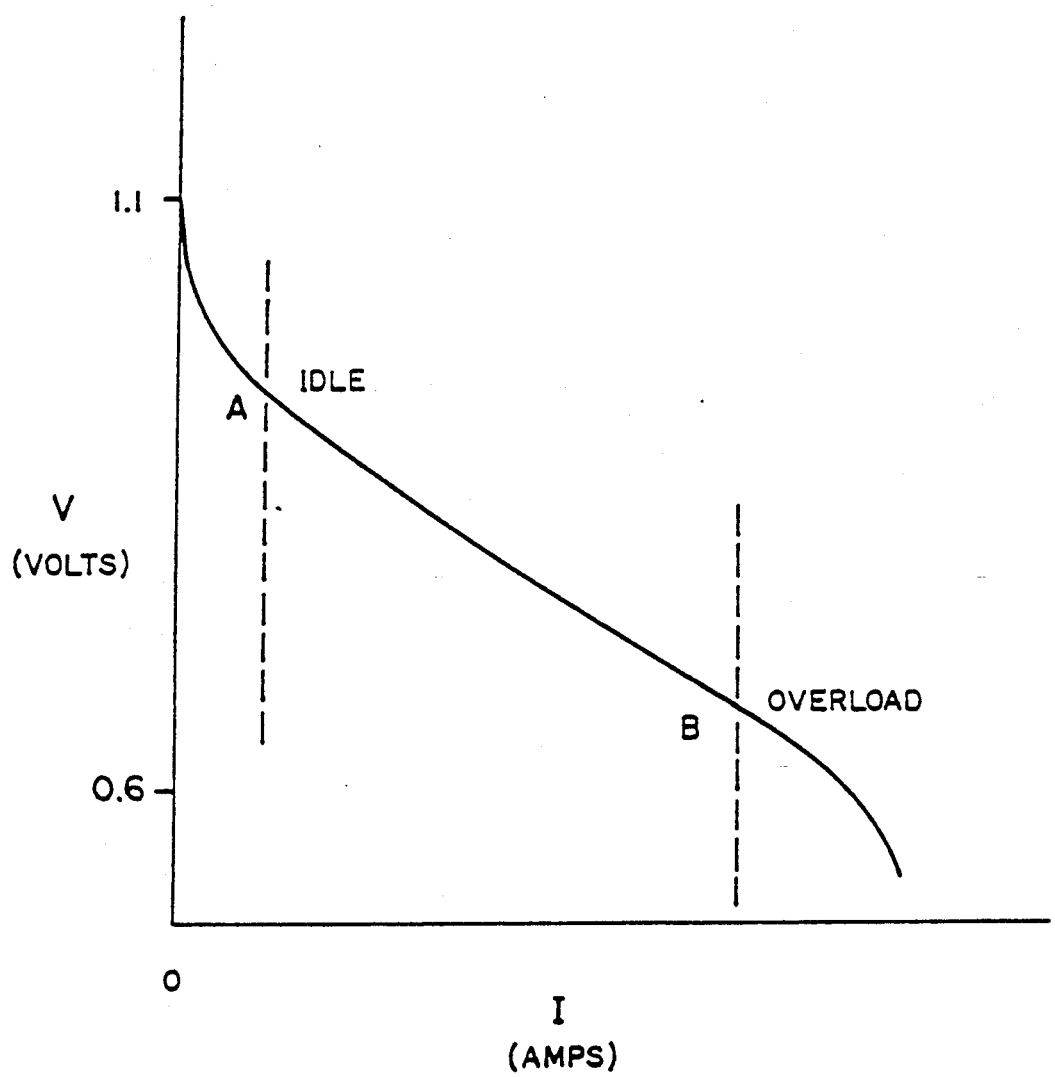
FIG. 2 illustrates a graphical plot of voltage versus current for a typical fuel cell operating under various load.

Referring to FIG. 2, which illustrates a graphical plot of voltage versus current generated by a single fuel cell, it can be seen that as a general rule, voltage of the fuel cell drops proportionately to load. When in idle mode, that is, when no load is placed on the fuel cell, the voltage is in the region of about 0.9 to 1.0 volts. Current levels are very low. With increased loads, the voltage drops proportionately so that at higher current levels, the voltage is about 0.6 volts. At a very high current (load) level, an overload situation can be reached. This overload should be avoided for reasons explained below. It is important for proper performance of the invention that the cell voltage comparator effectively monitors fuel cell performance over the acceptable load range running from idle to full load, as well as into the overload range, even though that state is to be avoided. Under most operating situations, conditions are not static so the load placed on the fuel cell group is not uniform or consistent. Thus the voltages and current levels can fluctuate considerably. This leads to time domain problems and problems in electronic scanning techniques for the cell groups. The inventors are of the view that the third method described above is the best of the three methods for ensuring that reference voltages and measured voltages keep in step in a dynamic environment.

The cell voltage comparator used according to any of the methods described above can detect any of the following adverse conditions in a fuel cell stack connected in electrical series:

1. A punctured membrane electrode assembly;
2. A cell polarity reversal (e.g. $-1.4$ volts) which can be potentially dangerous because it may produce oxygen on the hydrogen side of the cell and may produce hydrogen on the oxygen side of the cell;
3. Cell voltage sharing imbalance;
4. Poor water management in the flow fields of the fuel cells;
5. Loss of recirculation gas flow in the fuel cell stack;
6. Cell reactant gas flow imbalance (poor manifolding);
7. Low membrane electrode assembly performance; and
8. Low reactant pressure/flow performance (low fuel indicator).

Referring to FIG. 3, the analog to digital converter monitors the output voltage of cell groups 1 to 4. The voltages $V_1$ to $V_4$ are converted into a digital code and input into the input multiplexer. The group voltages are read by the CPU and their value is stored in memory. All of the group voltages are added and then divided by the number of groups to get the reference voltage. This voltage is then sequentially compared to each group voltage. If the group voltage is less than the reference voltage by a preset amount, the CPU outputs a signal distributed by the output multiplexer that can turn off the $H_2$ and $O_2$ solenoid valves, load contactor, $H_2$ recirculation compressor, $H_2$ pump motor, fan motor, open an $H_2$ vent and $N_2$ purge solenoid valve and turn on an audible or visual alarm.

When the cell voltage comparator of the invention senses below standard fuel cell performance of one or more cells, in the fuel cell stack, according to any of the methods described above, the comparator can initiate appropriate remedial changes to the process controls or, if required, initiate a shut-down sequence as follows:

1. Terminate the flow of feed reactant gas to the cells;
2. Open a load contactor;
3. Turn off all system support motors;
4. Automatically vent all reactant gas reservoirs;
5. Open a pressurized inert gas feed valve which permits inert gas to flow through all fuel cell lines thereby purging the fuel recirculation loop; and
6. Activate an audible or visual alarm.

While the specific embodiments of the method and apparatus for monitoring fuel cell performance described above relate to a cell voltage comparator, it will be appreciated that the method and apparatus can be adapted to monitor other fuel cell performance indicators, such as the temperature, pressure and flow rates of the reactants and reaction products within the fuel cells. In these instances, the temperature of the fuel cells would be measured using thermocouples or other suitable temperature measurement means, the pressure would be measured using pressure transducers or other suitable pressure measuring means, and flow rates would be measured using flow meters or other suitable fluid flow measuring means. Rather than comparing the measured voltages to a reference voltage as in the fuel cell comparator, the temperature, pressure, flow rates or other performance indicator within representative fuel cells would be compared to a reference value such as a predetermined minimum value, the average value over all fuel cell groups, or the value in an adjacent fuel cell group to detect out of bounds conditions.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A method of monitoring the performance of a plurality of series connected fuel cells comprising:
   a. dividing the fuel cells into at least three groups,
   b. measuring the voltage across each fuel cell group, and
   c. comparing the normalized measured voltage of one fuel cell group as a reference voltage with the normalized measured voltage of each of the other fuel cell groups.

2. The method of claim 1 further comprising:
   d. activating an alarm when the normalized measured voltage across a fuel cell group varies from said reference voltage by a predetermined voltage differential.

3. The method of claim 2 wherein said predetermined voltage differential is between about 20 millivolts per cell and about 200 millivolts per cell.

4. The method of claim 2 wherein said predetermined voltage differential is about 100 millivolts per cell.

5. The method of claim 2 further comprising:
   e. performing steps (a) through (d) repeatedly and discontinuing the supply of fuel to the fuel cells upon continuous activation of said alarm for a predetermined time period.

6. The method of claim 5 wherein said predetermined time period is between about 0.5 seconds and about 2.0 seconds.

7. The method of claim 1 wherein said comparison is performed iteratively, said one fuel cell group in the first iteration being selected from the plurality of fuel cell groups, said one fuel cell group in succeeding iterations being selected from the remaining, previously unselected fuel cell groups, said iterations being performed until each of the said fuel cell groups has been selected as said one fuel cell group for said comparison, the number of iterations required for each of said fuel cell groups to be selected as said one fuel cell group for said comparison constituting a comparison cycle.

8. The method of claim 7 wherein said fuel cells are divided into at least three groups including a first outer fuel cell group, at least one inner fuel cell group, and a second outer fuel cell group, said first outer group being selected as said one fuel cell group in the first iteration, the adjacent inner group being selected as said one fuel cell group in the second iteration, the next adjacent inner groups, if any, being selected in sequence as said one fuel cell group in succeeding iterations, and said second outer group being selected as said one fuel cell group in the final iteration.

9. The method of claim 8 wherein said comparison cycle is performed repeatedly.

10. A method of monitoring the performance of a plurality of series connected fuel cells comprising:
   a. dividing the fuel cells into at least three groups including a first outer fuel cell group, at least one inner fuel cell group, and a second outer fuel cell group,
   b. measuring the voltage across each fuel cell group,
   c. comparing the normalized measured voltage of said first outer fuel cell group as a reference voltage with the normalized measured voltage of the adjacent inner fuel cell group,
   d. comparing in sequence the normalized measured voltage of each inner fuel cell group as a reference voltage with the normalized measured voltage of the next adjacent fuel cell group, and
   e. comparing the normalized measured voltage of said second outer fuel cell group as a reference voltage with the normalized measured voltage of said first outer fuel cell group.

11. The method of claim 10 further comprising:
   f. activating an alarm when the normalized measured voltage across a fuel cell group varies from said reference voltage by a predetermined voltage differential.

12. The method of claim 11 wherein said predetermined voltage differential is between about 20 millivolts per cell and about 200 millivolts per cell.

13. The method of claim 11 wherein said predetermined voltage differential is about 100 millivolts per cell.

14. The method of claim 11 further comprising:
   g. performing steps (a) through (f) repeatedly and discontinuing the supply of fuel to the fuel cells upon continuous activation of said alarm for a predetermined time period.

15. The method of claim 14 wherein said predetermined time period is between about 0.5 seconds and about 2.0 seconds.

16. A method of monitoring the performance of a plurality of electrical series connected fuel cells comprising:
   a. dividing the fuel cells into at least three groups,
   b. measuring the voltage across each fuel cell group,
   c. comparing the normalized measured voltage of each fuel cell group with a first reference voltage equal to a predetermined minimum voltage, and
   d. comparing the normalized measured voltage of one fuel cell group as a second reference voltage with the normalized measured voltage of each of the other fuel cell groups.

17. The method of claim 16 further comprising:
   e. activating an alarm when the normalized measured voltage across a fuel cell group is less than said first reference voltage or when the normalized measured voltage across a fuel cell group varies from said second reference voltage by a predetermined voltage differential.

18. The method of claim 17 wherein said predetermined minimum voltage is about 0.5 volts per cell and said predetermined voltage differential is between about 20 millivolts per cell and about 200 millivolts per cell.

19. The method of claim 17 wherein said predetermined minimum voltage is about 0.5 volts per cell and said predetermined voltage differential is about 100 millivolts per cell.

20. The method of claim 17 further comprising:
   f. performing steps (a) through (e) repeatedly and discontinuing the supply of fuel to the fuel cells upon continuous activation of said alarm for a predetermined time period.

21. The method of claim 20 wherein said predetermined time period is between about 0.5 seconds and about 2.0 seconds.

22. A method of monitoring the performance of a plurality of electrical series connected fuel cells comprising:
   a. dividing the fuel cells into at least three groups including a first outer fuel cell group, at least one inner fuel cell group, and a second outer fuel cell group,
   b. measureing the voltage across each fuel cell group,
   c. comparing the normalized measured voltage of each fuel cell group with a first reference voltage equal to a predetermined minimum voltage,
   d. comparing the normalized measured voltage of said first outer fuel cell group as a second reference voltage with the normalized measured voltage of the adjacent inner fuel cell group,
   e. comparing in sequence the normalized measured voltage of each inner fuel cell group as a second reference voltage with the normalized measured voltage of the next adjacent fuel cell group, and
   f. comparing the normalized measured voltage of said second outer fuel cell group as a second reference voltage with the normalized measured voltage of said first outer fuel cell group.

23. The method of claim 22 further comprising:
   g. activating an alarm when the normalized measured voltage across a fuel cell group is less than said first reference voltage or when the normalized measured voltage across a fuel cell group varies from said second reference voltage by a predetermined voltage differential.

24. The method of claim 23 wherein said predetermined minimum voltage is about 0.5 volts per cell and said predetermined voltage differential is between about 20 millivolts per cell and about 200 millivolts per cell.

25. The method of claim 23 wherein said predetermined minimum voltage is about 0.5 volts per cell and said predetermined voltage differential is about 100 millivolts per cell.

26. The method of claim 23 further comprising:
h. performing steps (a) through (g) repeatedly and discontinuing the supply of fuel to the fuel cells upon continuous activation of said alarm for a predetermined time period.

27. The method of claim 26 wherein said predetermined time period is between about 0.5 seconds and about 2.0 seconds.

28. A method of monitoring the performance of a plurality of electrical series connected fuel cells comprising:
a. dividing the fuel cells into at least three groups,
b. measuring the voltage across each fuel cell group,
c. comparing the normalized measured voltage of each fuel cell group with a first reference voltage equal to a predetermined minimum voltage,
d. comparing the normalized measured voltage of each fuel cell group with a second reference voltage equal to the normalized total voltage across the plurality of series connected fuel cells, and
e. comparing the normalized measured voltage of one fuel cell group as a third reference voltage with the normalized measured voltage of each of the other fuel cell groups.

29. The method of claim 28 further comprising:
f. activating an alarm when the normalized measured voltage across a fuel cell group is less than said first reference voltage or when the normalized measured voltage across a fuel cell group varies from said second reference voltage or said third reference voltage by a predetermined voltage differential.

30. The method of claim 29 wherein said predetermined minimum voltage is about 0.5 volts per cell and said predetermined voltage differential is between about 20 millivolts per cell and about 200 millivolts per cell.

31. The method of claim 29 wherein said predetermined minimum voltage is about 0.5 volts per cell and said predetermined voltage differential is about 100 millivolts per cell.

32. The method of claim 29 further comprising:
g. performing steps (a) through (f) repeatedly and discontinuing the supply of fuel to the fuel cells upon continuous activation of said alarm for a predetermined time period.

33. The method of claim 32 wherein said predetermined time period is between about 0.5 seconds and about 2.0 seconds.

34. A method of monitoring the performance of a plurality of electrical series connected fuel cells comprising:
a. dividing the fuel cells into at least three groups including a first outer fuel cell group, at least one inner fuel cell group, and a second outer fuel cell group,
b. measuring the voltage across each fuel cell group,
c. comparing the normalized measured voltage of each fuel cell group with a first reference voltage equal to a predetermined minimum voltage,
d. comparing the normalized measured voltage of each fuel cell group with a second reference voltage equal to the normalized total voltage across the plurality of series connected fuel cells,
e. comparing the normalized measured voltage of said first outer fuel cell group as a third reference voltage with the normalized measured voltage of the adjacent inner fuel cell group,
f. comparing in sequence the normalized measured voltage of each inner fuel cell group as a third reference voltage with the normalized measured voltage of the next adjacent fuel cell group, and
g. comparing the normalized measured voltage of said second outer fuel cell group as a third reference voltage with the normalized measured voltage of said first outer fuel cell group.

35. The method of claim 34 further comprising:
h. activating an alarm when the normalized measured voltage across a fuel cell group is less than said first reference voltage or when the normalized measured voltage across a fuel cell group varies from said second reference voltage or said third reference voltage by a predetermined voltage differential.

36. The method of claim 35 wherein said predetermined minimum voltage is about 0.5 volts per cell and said predetermined voltage differential is between about 20 millivolts per cell and about 200 millivolts per cell.

37. The method of claim 35 wherein said predetermined minimum voltage is about 0.5 volts per cell and said predetermined voltage differential is about 100 millivolts per cell.

38. The method of claim 35 further comprising:
i. performing steps (a) through (h) repeatedly and discontinuing the supply of fuel to the fuel cells upon continuous activation of said alarm for a predetermined time period.

39. The method of claim 38 wherein said predetermined time period is between about 0.5 seconds and about 2.0 seconds.

* * * * *